US005623264A

United States Patent [19]
Park

[11] Patent Number: 5,623,264
[45] Date of Patent: Apr. 22, 1997

[54] VIDEO DIGITAL/ANALOG SIGNAL CONVERTER

[75] Inventor: Yong-In Park, Seoul, Rep. of Korea

[73] Assignee: Goldstar Electron Co., Ltd., Cheongju, Rep. of Korea

[21] Appl. No.: 336,686

[22] Filed: Nov. 4, 1994

[30] Foreign Application Priority Data

Nov. 5, 1993 [KR]  Rep. of Korea ............ 5-023449

[51] Int. Cl.$^6$ .................................................. H03M 1/66
[52] U.S. Cl. .................................................. 341/144
[58] Field of Search ........................... 341/144, 136, 341/153

[56] References Cited

U.S. PATENT DOCUMENTS 5,410,311  4/1995  Doyle ............................ 341/144

OTHER PUBLICATIONS

"A CMOS Triple 100-Mbit/s Video D/A Converter with Shift Register and Color Map", by Kuang K. Chi et al, IEEE Journal of Solid-State Circuits, vol. SC-21, No. 6, Dec. 1986.

Primary Examiner—Brian K. Young
Attorney, Agent, or Firm—Fleshner & Kim

[57] ABSTRACT

A video digital/analog signal converter having a structure whereby the analog elements of the video D/A converter are separated from the digital elements of the video D/A converter and of arranging current cells of each of channels to one well. The present invention includes a Red-decoder group, a Green-decoder group, and a Blue-decoder group for decoding digital data of R, G, and B color channels, respectively, which are inputted in a state synchronized to R, G, and B clocks for controlling digital data of Red, Green, and Blue color channels. A plurality of data buses transfers digital data of R, G, and B color channel decoded at the R, G, and B decoder groups. First R, G, and B current cell matrixes generate current in response to digital data of the R, G, and B color data inputted from the data buses. Second R, G, and B current cell matrixes generates current in response to digital data of the R, G, and B color channel inputted through the data buses. The bias circuit transfers biases to the first R, G, and B current cell matrixes and the second R, G, and B current matrixes.

19 Claims, 4 Drawing Sheets

PROCESS VARIATION 5,623,264

VIDEO DIGITAL/ANALOG SIGNAL CONVERTER

BACKGROUND OF THE INVENTION

1. Field of the Invention

The present invention relates in general to a video digital/analog signal converter, and in particular to a video digital/analog signal converter having a structure whereby the analog elements of the video D/A converter are separated from the digital elements of the video D/A converter and of arranging current cells of each of channels to one well, thus preventing data crosstalk between neighboring channels, and in addition by arranging the current channels to be disposed in four directions thus preventing errors due to process variations occurring during manufacturing processes whereby a compact chip will be achieved by a correction arrangement of the current cells.

2. Description of the Conventional Art

Conventionally, a video digital/analog converter as shown in FIG. 1, includes a clock generating circuit 10 for generating R, G, and B clocks in order to control digital data of Red, and Green Blue channels; a mid-decoder 20 for decoding digital data synchronized to a clock signal of the clock generating circuit and located at the fight side of the clock generating circuit 10; a data bus 30 for transferring decoded digital data located at the upper side of the clock generating circuit 10 and the mid-decoder 20; an upper decoder 40 for decoding digital data synchronized to a clock signal of the clock generating circuit 10 and inputted from the data bus 30; a data bus 50 for transferring digital data decoded at the upper decoder 40; a current cell matrix 60 for generating current in response to digital data inputted through the data buses 30 and 50 is located in their order; and a bias circuit 70 for applying bias voltage to the current cell matrix 60.

The current cell matrix 60 consists of a plurality of packs each of which consists of channels of each of R, G, and B.

Referring to FIG. 2, one cell unit consists of current cells of each of R (cell 1), G (cell 2), B (cell 3), which are arrayed on a substrate, as shown therein. A stopper for preventing crosstalk is disposed between channels and the resistance which exists between the channels is indicated as 'r.'

Referring to FIG. 3, there is shown a conventional current cell circuit. As shown therein, digital data D and a bias voltage vb1 are respectively applied to gates of nMOS transistors M1 and M2 of a differential amplifier. In addition, the source regions of nMOS transistors M1 and M2 are connected to each other and connected to a drain of a nMOS transistor M3. A bias voltage vb2 is applied to a gate of the nMOS transistor M3.

The operation of the conventional video digital/analog converter will now be described.

If digital data controlled by R, G, and B clocks of a clock generating circuit 10 are inputted into the mid-, upper, and lower decoders 20, 40 and 80, the mid-, upper, and lower decoders 20, 40 and 80 decode the inputted digital data and output the decoded data to the current cell matrix 60 through the data buses 30 and 50. Thereafter, the current cell matrix 60 generates current in proportion to a difference between the digital data inputted from the data buses 30 and 50 and a bias voltage supplied from the bias circuit 70. That is, as shown in FIG. 3, if the value of the digital data D applied to the gate of the nMOS transistor M1 is larger than a bias voltage vb1 applied to a gate of the nMOS transistor M2, and if the bias voltage vb2 applied to a gate of the nMOS transistor M3 is larger than a threshold voltage of the nMOS transistor M3, the differentially amplified output current $\bar{I}_o$ is applied to the drain of the nMOS transistor M3 through the nMOS transistor M1. However, under the aforementioned conditions, if the bias voltage vb1 applied to the gate of the nMOS transistor M2 is larger than digital data D applied to the gate of the nMOS transistor M1, the current Io is applied to the drain of the nMOS transistor M3 through the nMOS transistor M2. Here, the output current $\bar{I}_o$ and $I_o$ means that the levels thereof are contrary from each other. In addition, the mid-, upper and lower decoders 20, 40 and 80, if assuming the digital data inputted is 8 bits long, process 8 data bits by separating them into three bits and two bits.

A cell matrix 60 of each channel is arranged as shown in FIG. 4. However, since each of the current cells of the conventional current cell matrix 60 is arranged in the same direction, the process variations occurring during mass production appear at every cell in the X- and Y-directions. Accordingly, an integral Non-Linearity Error affecting the relation between the outputted analog signal against the inputted digital signal might be heat-damaged in the X- and Y-directions thereof. In addition, since the clock generating circuit 10, the mid-, upper and lower decoders 20, 40 and 80, the current cell matrix 60 and the bias circuit 70 are arrayed in one well, the crosstalk in which undesirable digital noise is transferred into the other channels through the interchannel resistance increases and thus the chip size must be increased to avoid this problem.

SUMMARY OF THE INVENTION

Accordingly, it is an object of the present invention to provide a video digital/analog signal converter having a structure whereby the analog elements of the video D/A converter are separated from the digital elements of the video D/A converter and preventing crosstalk between neighboring channels by arraying the current cells of each channel within one well.

To achieve the object of the present invention, the converter includes a Red-decoder group, a Green-decoder group, and a Blue-decoder group for decoding digital data of R, G, and B color channels, respectively, which are inputted in a state synchronized to R. G, and B clocks for controlling digital data of the Red, Green, and Blue color channels; a plurality of data buses for transferring digital data of the R, G, and B color channels decoded at the R. G, and B decoder groups; R, G, and B current cell matrixes for generating current in response to digital data of the R, G, and B color data inputted from the data buses; lower R, G, and B current cell matrixes for generating current in response to digital data of the R, G, and B color channel inputted through the data buses; and a bias circuit for applying bias current to the R, G, and B current cell matrixes and the lower R, G, and B current cell matrixes.

BRIEF DESCRIPTION OF THE DRAWINGS

The objects and features of the invention may be more readily understood with reference to the following detailed description of an illustrative embodiment of the invention, taken together with the accompanying drawings in which.

DESCRIPTION OF THE PREFERRED EMBODIMENTS

Figure 1:
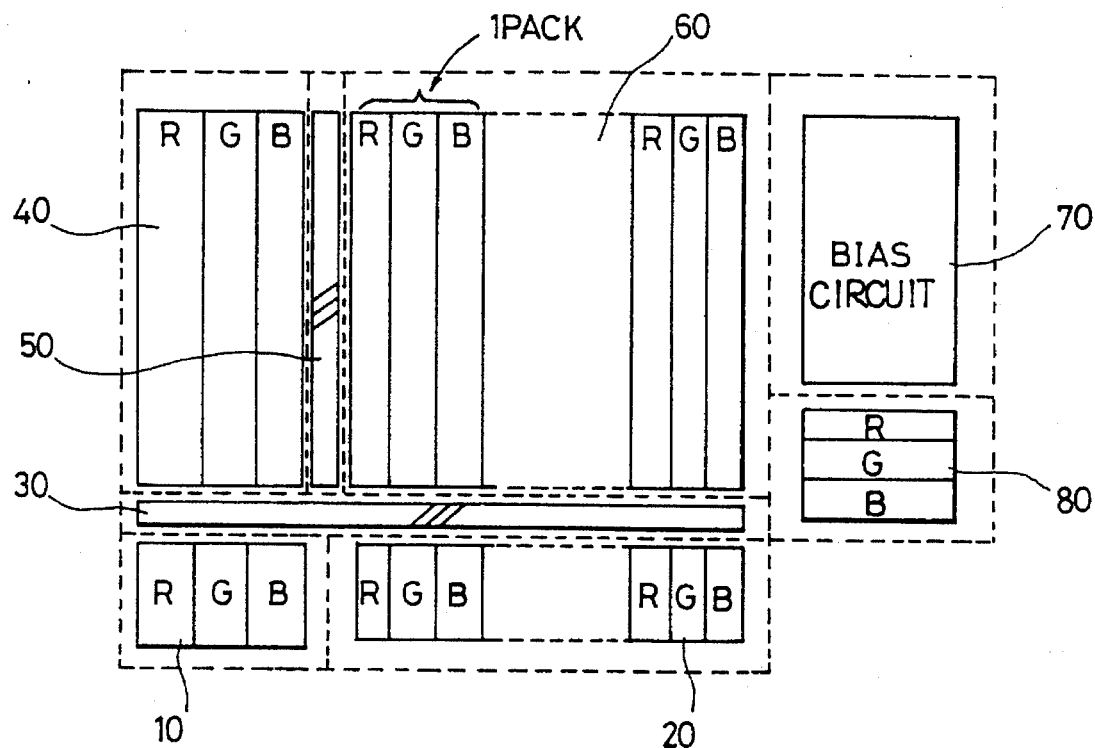
FIG. 1 is a layout diagram showing a conventional video digital/analog converter.
Figure 2:
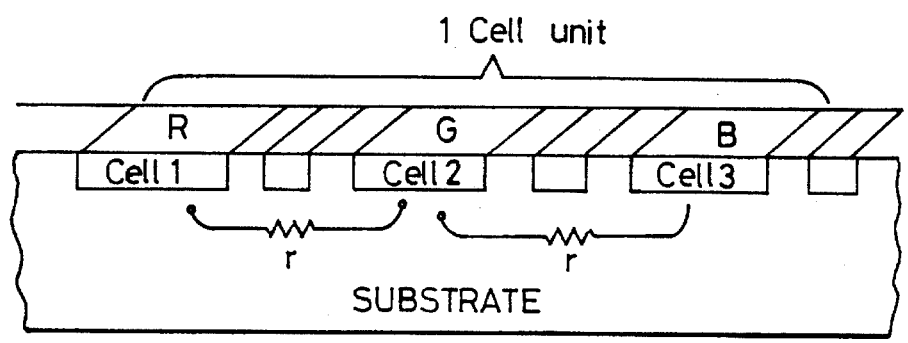
FIG. 2 is a cross-sectional view showing one pack of a current cell matrix in FIG. 1.
Figure 3:
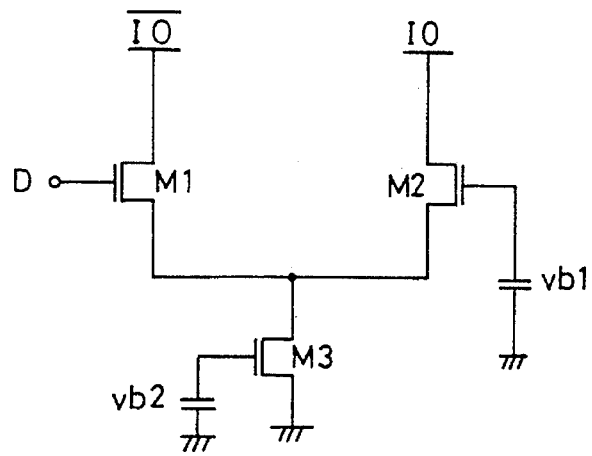
FIG. 3 is a circuit diagram showing a current cell in FIG. 2.
Figure 4:
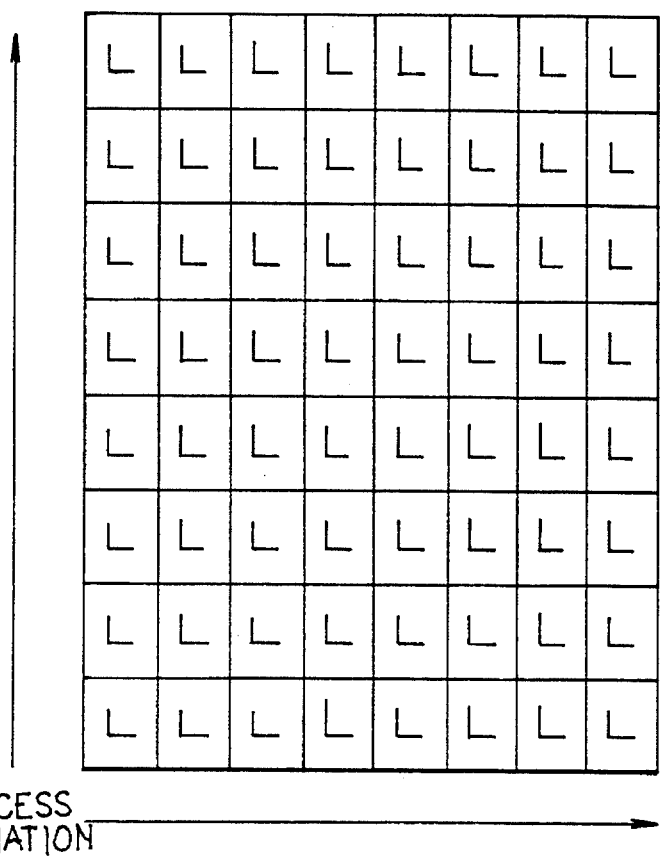
FIG. 4 is a layout diagram showing a conventional current cell matrix.
Figure 5:
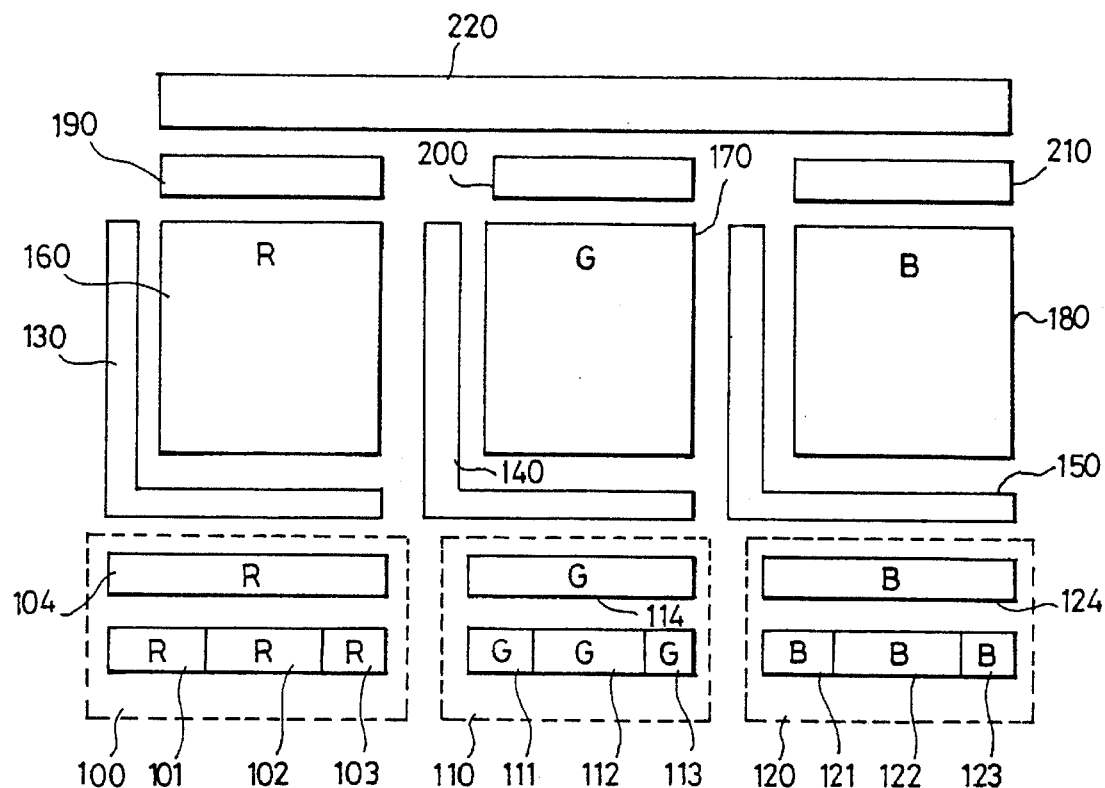
FIG. 5 is a layout diagram showing a video digital/analog converter according to the present invention.

Referring to FIG. 5, there is shown a diagram of a video digital/analog converter according to the present invention. As shown therein, it includes an R decoder group 100, a G decoder group 110 and a B decoder group 120 for respectively decoding digital data which is synchronized to R, G, and B clocks respectively controlling digital data of Red, Green, and Blue color channels. L-shaped data buses 130, 140 and 150 are provided for respectively transferring digital data from the R, G, and B decoders 100, 110, and 120. The converter further includes R, G, and B current cell matrixes 160, 170 and 180 each for generating current in response to digital data inputted from the data buses 130, 140, and 150. Lower R, G, and B current cell matrixes 190, 200, 210 are located above the R, G, and B current cell matrixes 160, 170, 180, respectively and bias circuit 220, located above the lower R, G, and B current cell matrixes 190, 200, 210, for supplying voltage to the R, G, and B current cell matrixes 160, 170, 180 and the lower R, G, and B current cell matrixes 190. 200. 210. Here, the lower R, G, and B current cell matrixes 190, 200, 210 have the same structure and operation to that of the R, G, and B current cell matrixes 160, 170, 180. For downsizing the chip and simplifying the circuit control, the lower R, G, and B current cell matrixes 190, 200, 210 are differentially developed from the R, G, and B current cell matrixes 160, 170, 180.

The R decoder group 100 includes an R clock generating circuit 101 for controlling digital data of a Red color channel; a mid-decoder 102 for separating and decoding digital data of the Red color channel, a lower decoder 103, and an upper decoder 104 for decoding digital data of the Red color channel. In case of the G and B decoder groups 110 and 120, they have the same structure as the aforementioned R decoder group 100.

In the present invention, the bias circuit 220 which is an analog part, the R, G, and B current cell matrixes 160, 170, 180 and the lower R, G, and B current cell matrixes 190, 200, 210 are separated from the R, G, and B decoder groups 100, 110, 120 which are the digital parts, and in particular from the bias circuit 220 which is responsible for the digital noise and which should be located at the remotest place.

Figure 6:
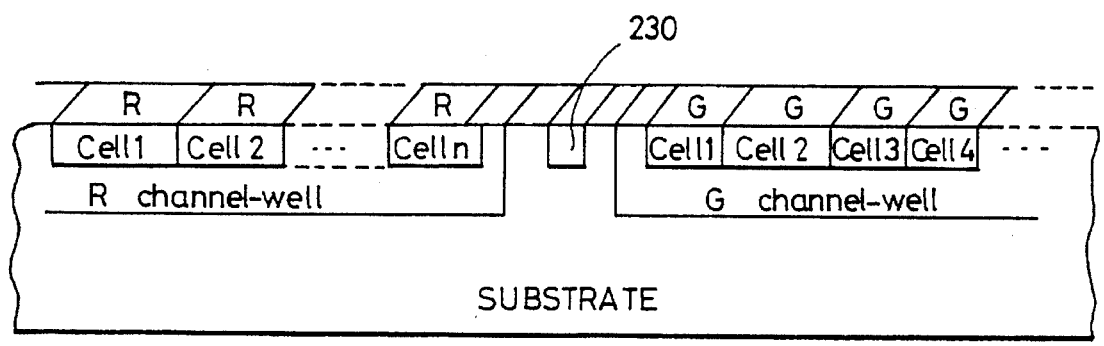
FIG. 6 is a cross-sectional view showing one pack of a current cell matrix in FIG. 5.

Referring to FIG. 6, there are shown R, G, and B current cell matrixes 160, 170, 180 and Lower R, G, and B current cell matrixes 190, 200, 210. As shown therein, each channel of R, G, and B is disposed within one well. A channel stopper 230 is disposed between wells of each channel, and each channel shares at least one substrate.

Figure 7:
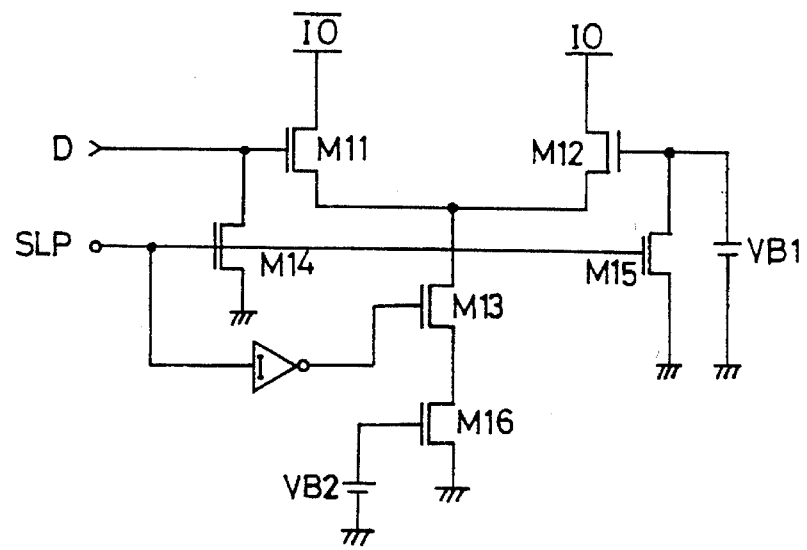
FIG. 7 is a circuit diagram showing a current cell in FIG. 6.

Referring to FIG. 7, there is shown a current cell circuit. As shown therein, decoded digital data D and bias voltage bv1 are applied to a gate of the nMOS transistors M11 and M12. The drain of the nMOS transistors M11 and M12 are respectively connected to the output terminal. The source of the nMOS transistors M11 and M12 is commonly connected each other. In addition, at the nMOS transistors M14 and M15, the drains are connected to the gates of the nMOS transistors M11 and M12. The sleeping signal SLP is applied to the gates. The source thereof is grounded. The drain of the nMOS transistor M13 is connected to a source common point. The sleeping signal SLP is applied to the gate through the inverter I. The source is connected to the drain of a nMOS transistor M16. In addition, the drain of the nMOS transistor M16 is connected to the source of the nMOS transistor M13. The bias voltage Vb2 is applied to the gate and the source thereof is grounded. Here, the sleeping signal SLP is the signal, inputted when the user selects the function such as a screen production or a mute, for stopping the operation of the current cell.

Figure 8:
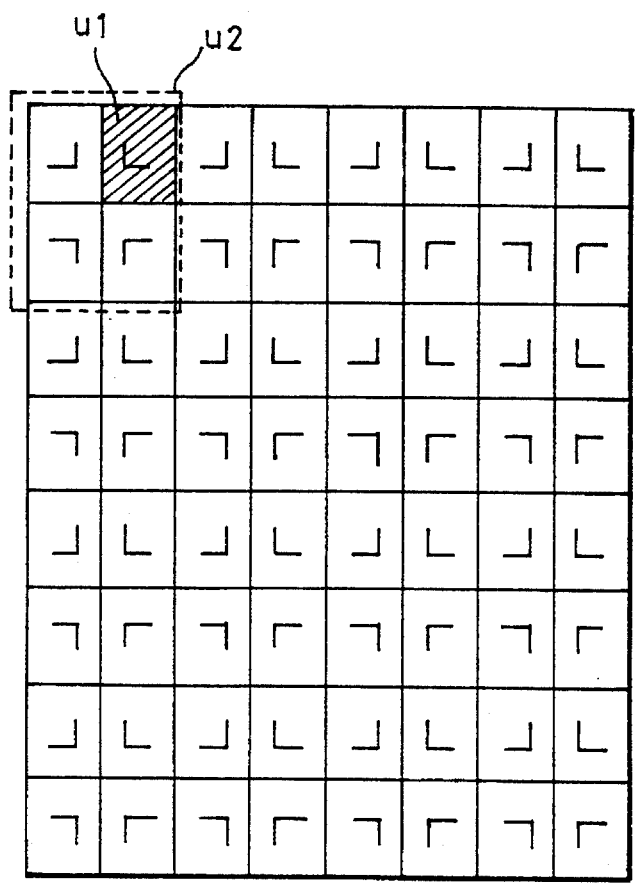
FIG. 8 is a layout diagram showing a current cell matrix according to the present invention.

Referring to FIG. 8, the current cell matrix consists of a plurality of current cell units U2, in which one current cell unit U2 consists of four current cells U1 which are arranged to be symmetrical in four directions each other in such a form that the four current cells are symmetrical to X-axis, Y-axis and the origin of the coordinate axes.

The operation and effects of the video digital/analog converter according to the present invention will now be described with a reference to accompanying drawings.

If N-bit digital data, synchronized to the clock signal of the R, G, and B clock generating circuits 101, 111, 121, are inputted to the upper decoders 104, 114, 124, the mid-decoders 102, 112, 122 and the lower decoders 103, 113, 123 of the R, G, and B decoder groups 100, 110, 120, respectively, the R, G, and B decoder groups 100, 110, 120 decode the digital data in a form of $2^n$ and outputs the decoded value to the R, G, and B current cell matrixes 160, 170, 180 through the data buses 130, 140, 150. In addition, the R, G, and B current cell matrixes 160, 170, 180 amplifies differentially the decoded digital data inputted through the data buses 130, 140, 150 and the bias voltage inputted from the bias circuit 220.

The current generating procedure at the R, G, and B current cell matrixes 160, 170, 180 will now be described with reference to FIG. 7.

If the bias voltage Vb1 which is inputted from the digital data D and the bias circuit 220 is applied to the gate of the nMOS transistors M11 and M12, the current differentially amplified in response to two signals generates at the nMOS transistors M13 and M16. Here, the current value Io, controlled by the bias voltage Vb2 applied to the gate of the nMOS transistor M16 from the bias circuit 220, at the nMOS transistor M16 will be obtained from the following formula.

$$Io = \frac{\mu \epsilon W}{2T_{ox}L}(V_{B2}-V_T)^2 \times (1+\lambda V_{DS}) \quad \text{[formula 1]}$$

Here, where 'μ' is a mobility, 'ε' is a dielectric constant, 'W' is a width of a gate oxide, 'L' is a length of a gate oxide, '$T_{ox}$' is a thickness of a gate oxide, '$V_T$' is a threshold voltage, 'λ' is a semiconductor parameter, and '$V_{DS}$' is a voltage between a drain and a source.

At this time, if the user selects one function such as a screen protection or a mute, the sleeping signal become a high state H since the power of the current cell matrix is cut. Thereafter, the sleeping signal in a high state H is respectively applied to the gate of the nMOS transistors M14 and M15, the nMOS transistors M14 and M15 will be turned-on thereby. In addition, since the sleeping signal SLP converted to a low state L at the inverter I is applied to the gate of the nMOS transistor M13, the nMOS transistor M13 will be turned off. Therefore, since the digital data D and the bias voltage Vb1 flow through the nMOS transistors M14 and M15, the flowing path of the current Io which flows through the nMOS transistor M16 is cut off and the value thereof become zero.

Meanwhile, if the user does not select the function such as a screen protection or a mute, the sleeping signal SLP becomes a low state L and then the nMOS transistors M14 and M15 become turned off. Therefore, the nMOS transistors M11 and M12 amplify differentially the decoded digital data D and the bias voltage Vb1 which are respectively applied to the respective gates. In addition, if the sleeping signal SLP converted to a high state H at the converter I is applied to the gate of the nMOS transistor M13, the nMOS transistor M13 becomes turned on and the current flowing path is formed thereby. Thereafter, the nMOS transistor M16 becomes turned on by the bias voltage Vb2, current like a result value from the formula I is obtained. Meanwhile, the lower R, G, and B current cells 190, 200, 210 works in the same way to that of the R, G, and B current cells 160, 170, 180.

At this time, at the current cell, the common mode rejection ratio which is a ratio of the signal output against the common signals will be improved rather than that of the conventional current cell, and if the digital data is N-bit, the number of the current cell is $2^n-1$ in each channel. That is, if the digital data inputted is 8-bit, the number of the current cell is 255. However, during manufacturing process, the natural properties of the 155 current cell cannot be achieved to be even, so the taping phenomenon which the one-sided natural properties might occur, In addition, the amount of the current flowing onto the surface of the silicon is slightly changed according to its flowing direction.

Therefore, in the video digital/analog converter, the current cell matrixes are ranged like that shown in FIG. 8. The current cell unit U2 of the current cell matrixes is that the four current cells U1 which are completely the same in its size and circuit structure of transistors thereof is symmetrical layouts against X-axis, Y-axis and the origin of the coordinate axes. Thereafter, even though the 255 current cells work, the errors accumulated due to the process variation occurred during manufacturing processes like the conventional current cell matrixes can be prevented and the flowing direction of the large current which occurs while the input signal changes in 00→FF→00 direction is evenly distributed in four directions, so that the settling time is significantly improved. In addition, since the ground and output terminals of the current cells are located at the most upper portion and the most lower portion of each of the cells, the chip size is reduced 50% comparing with the conventional one because of the correction arrangement of the current cell. In addition, the process variation occurring during manufacturing is significantly improved and the linearity will be achieved at a high speed operation, thus preventing crosstalk of data between neighboring channels.

Although the preferred embodiments of the present invention have been disclosed for illustrative purpose, those skilled in the art will appreciate that various modifications, additions and substitutions are possible, without departing from the scope and spirit of the invention as recited in the accompanying claims.

What is claimed is:

1. A video digital/analog converter, comprising:
    a Red(R)-decoder group, a Green(G)-decoder group, and a Blue(B)-decoder group for decoding digital data of R, G, and B color channels, respectively, which are inputted in a state synchronized to R, G, and B clocks for controlling digital data of R, G, and B color channels;
    a plurality of data buses for transferring digital data of the R, G, and B color channels decoded at the R, G, and B decoder groups;
    first R, G, and B current cell matrixes for generating current in response to decoded digital data of the R, G, and B color data inputted from the data buses;
    second R, G, and B current cell matrixes for generating current in response to decoded digital data of the R, G, and B color channel inputted through the data buses; and
    bias circuit for transferring biases to the first R, G, and B current cell matrixes and the second R, G, and B current cell matrixes.

2. The video digital/analog converter of claim 1, wherein said bias circuit, first R, G, and B current cell matrixes, and second R, G, and B current cell matrixes are separately located from the R, G, and B decoder groups.

3. The video digital/analog converter of claim 1, wherein each of said data buses is formed in an L-shape, one leg of which is located between the first R, G, and B current cell matrixes and other leg of which is located between the first R, G, and B current cell matrixes and the R, G, and B decoder groups.

4. The video digital/analog converter of claim 1, wherein each of said first R, G, and B current cell matrixes includes at least one channel.

5. The video digital/analog converter of claim 4, wherein each of said channels includes an independent layout from each other.

6. The video digital/analog converter of claim 5, wherein each of said channels shares at least one substrate.

7. The video digital/analog converter of claim 5, wherein each of said channels is separated from a channel stopper.

8. The video digital/analog converter of claim 1, wherein said first R, G, and B current cell matrixes includes at least one current cell unit having four current cells.

9. The video digital/analog converter of claim 8, wherein said four current cells of said current cell unit are symmetrical to X-axis, Y-axis and the origin of the coordinate axes to each other.

10. The video digital/analog converter of claim 8, wherein each of said current cells shares the same output terminals and ground by arranging the output terminal of each current cell at one side and the ground of each current cell at the other side.

11. The video digital/analog converter of claim 1, wherein each of said current cells of the second R, G, and B current cell matrixes have the same structure and operation as those of said first R, G, and B current cell matrixes.

12. The video digital/analog converter of claim 1, wherein said first R, G, and B current cell matrixes has a plurality of current cells, each said current cell comprising:
    a first nMOS transistor having a gate to which the decoded digital data of the R, G, and B color channels is applied and a drain connected to an output terminal;
    a second nMOS transistor having a gate to which a first bias voltage is applied, a drain is connected to another output terminal, and a source connected to a source of the first nMOS transistor;
    a third nMOS transistor having a drain connected in common to the sources of the first and second nMOS transistors, and a gate to which a sleeping signal converted by an inverter is applied;

a fourth nMOS transistor having a drain connected to the gate of the first nMOS transistor, a source which is grounded, and a gate to which the sleeping signal is applied;

a fifth nMOS transistor having a drain connected to the gate of the second nMOS transistor, a source which is grounded, and a gate to which the sleeping signal is applied; and a sixth nMOS transistor having a drain connected to a source of the third nMOS transistor, a source which is grounded, and a gate to which a second bias voltage is applied.

13. A digital to analog converter for a video display, comprising:
  a) a plurality of decoder groups, each decoder group having
    i) a plurality of decoders, and
    ii) a clock generator, said plurality of decoders decoding digital data, corresponding to a decoder group, synchronized with a clock signal of said clock generator;
  b) a plurality of data buses, each data bus transferring decoded digital data from corresponding decoder group;
  c) a plurality of first cell matrixes, each cell matrix for generating current in response to decoded digital data from said corresponding decoder groups, transferred through corresponding data bus;
  d) a plurality of second cell matrixes, each cell matrix for generating current in response to decoded digital data from said corresponding decoder groups transferred through corresponding data bus; and
  e) bias circuit for transferring biases to said plurality of first and second cell matrixes.

14. The digital to analog converter of claim 13, wherein each of said plurality of data buses has an L-shape.

15. The digital to analog converter of claim 14, wherein a first leg of said L-shape is located between adjacent first cell matrixes and a second leg is located between corresponding first cell matrix and decoder group.

16. The digital to analog converter of claim 13, wherein each of said plurality of first cell matrix comprises a plurality of current cell units, each current cell unit having four current cells.

17. The digital to analog converter of claim 16, wherein each of said current cell comprises:

a first transistor having a control electrode for receiving the decoded digital data, a first electrode for receiving a first predetermined potential and a second electrode;

a second transistor having a control electrode for receiving a first bias voltage, a first electrode for receiving a second predetermined potential and a second electrode, said second electrodes of said first and second transistors being coupled to one another;

a third transistor having a first electrode coupled to said second electrodes of said first and second transistors and a control electrode for receiving a first control signal;

a fourth transistor having a first electrode coupled to the control electrode of said first transistor, a second electrode for receiving a second predetermined potential and a control electrode for receiving a second control signal;

a fifth transistor having a first electrode coupled to said control electrode of said second transistor, a second electrode for receiving the second predetermined potential and a control electrode for receiving the second control signal; and a sixth transistor having a first electrode coupled to the second electrode of said third transistor, a second electrode for receiving the second predetermined potential and a control electrode to receive a second bias voltage.

18. The digital to analog converter of claim 16, wherein said four current cells of said current cell unit are symmetrical to each other.

19. The digital to analog converter of claim 17, wherein said plurality of second cell matrixes has the same structure as said plurality of first cell matrixes.

* * * * *

UNITED STATES PATENT AND TRADEMARK OFFICE
CERTIFICATE OF CORRECTION

PATENT NO : 5,623,264
DATED : April 22, 1997
INVENTOR(S): Yong-In PARK

It is certified that error appears in the above-identified patent and that said Letters Patent is hereby corrected as shown below:

Title page, item
[30] Foreign Application Priority Data change "5-023449" to --23449/1993--.

Signed and Sealed this

Thirtieth Day of May, 2000

Attest:

Attesting Officer

Q. TODD DICKINSON
Director of Patents and Trademarks